US009007134B2

(12) United States Patent
Matsuoka et al.

(10) Patent No.: US 9,007,134 B2
(45) Date of Patent: *Apr. 14, 2015

(54) CONSTANT-TEMPERATURE PIEZOELECTRIC OSCILLATOR AND METHOD OF MANUFACTURING THE SAME

(71) Applicant: Seiko Epson Corporation, Tokyo (JP)

(72) Inventors: Jun Matsuoka, Minamisoma (JP); Tadayoshi Soga, Minamisoma (JP); Akitoshi Ogino, Minamisoma (JP); Yuichi Oinuma, Minamisoma (JP)

(73) Assignee: Seiko Epson Corporation (JP)

( * ) Notice: Subject to any disclaimer, the term of this patent is extended or adjusted under 35 U.S.C. 154(b) by 63 days.

This patent is subject to a terminal disclaimer.

(21) Appl. No.: 13/857,437

(22) Filed: Apr. 5, 2013

(65) Prior Publication Data

US 2014/0070892 A1    Mar. 13, 2014

Related U.S. Application Data

(63) Continuation of application No. 13/026,375, filed on Feb. 14, 2011, now Pat. No. 8,482,356.

(30) Foreign Application Priority Data

Mar. 24, 2010  (JP) .................................. 2010-067497

(51) Int. Cl.
| H03L 1/02 | (2006.01) |
| H03L 1/04 | (2006.01) |
| H03B 5/32 | (2006.01) |
| H03B 5/04 | (2006.01) |

(52) U.S. Cl.
CPC ...... *H03L 1/04* (2013.01); *H03L 1/023* (2013.01); *H03B 5/32* (2013.01); *H03B 5/04* (2013.01); *H03L 1/022* (2013.01)

(58) Field of Classification Search
CPC ........... H03L 1/022; H03L 1/023; H03L 1/04; H03B 5/04; H03B 5/366; H03B 5/368
USPC ............. 331/116 R, 116 FE, 158, 176, 66, 69
See application file for complete search history.

(56) References Cited

U.S. PATENT DOCUMENTS

| 5,025,231 A | 6/1991 | Schwartzbach |
| 7,595,701 B2 | 9/2009 | Fukuda |

(Continued)

FOREIGN PATENT DOCUMENTS

| CN | 101027839 | 8/2007 |
| JP | 63-055614 | 4/1988 |

(Continued)

*Primary Examiner* — Ryan Johnson
(74) *Attorney, Agent, or Firm* — Harness, Dickey & Pierce, P.L.C.

(57) ABSTRACT

A constant-temperature piezoelectric oscillator includes: a piezoelectric vibrator; an oscillation circuit; a frequency voltage control circuit; a temperature control section; and an arithmetic circuit, wherein the temperature control section includes a temperature-sensitive element, a heating element, and a temperature control circuit, the frequency voltage control circuit includes a voltage-controlled capacitance circuit capable of varying the capacitance value in accordance with the voltage, and a compensation voltage generation circuit, and the arithmetic circuit makes the compensation voltage generation circuit generate a voltage for compensating a frequency deviation due to a temperature difference between zero temperature coefficient temperature Tp of the piezoelectric vibrator and setting temperature Tov of the temperature control section based on a frequency-temperature characteristic compensation amount approximate formula adapted to compensate the frequency deviation, and then applies the voltage to the voltage-controlled capacitance circuit to compensate the frequency.

16 Claims, 6 Drawing Sheets

(56) References Cited

U.S. PATENT DOCUMENTS

| | | |
|---|---|---|
| 7,782,150 B2 | 8/2010 | Stolpman |
| 8,482,356 B2 * | 7/2013 | Matsuoka et al. ............ 331/66 |
| 2006/0152294 A1 | 7/2006 | Kawasaki et al. |
| 2007/0229176 A1 | 10/2007 | Fukuda |
| 2009/0167447 A1 | 7/2009 | Babitch |
| 2009/0212877 A1 | 8/2009 | Ogasawara |

FOREIGN PATENT DOCUMENTS

| | | |
|---|---|---|
| JP | 64-082809 | 3/1989 |
| JP | 1-248806 | 10/1989 |
| JP | 02-096406 | 4/1990 |
| JP | 10-303645 | 11/1998 |
| JP | 2005-124022 A | 5/2005 |
| JP | 2007-251366 | 9/2007 |
| WO | 2006-008620 | 1/2006 |

\* cited by examiner

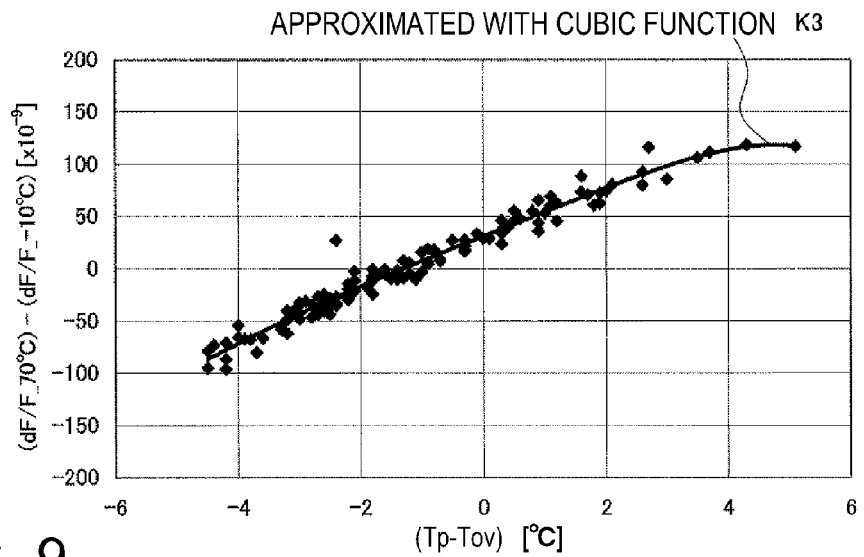
FIG. 9
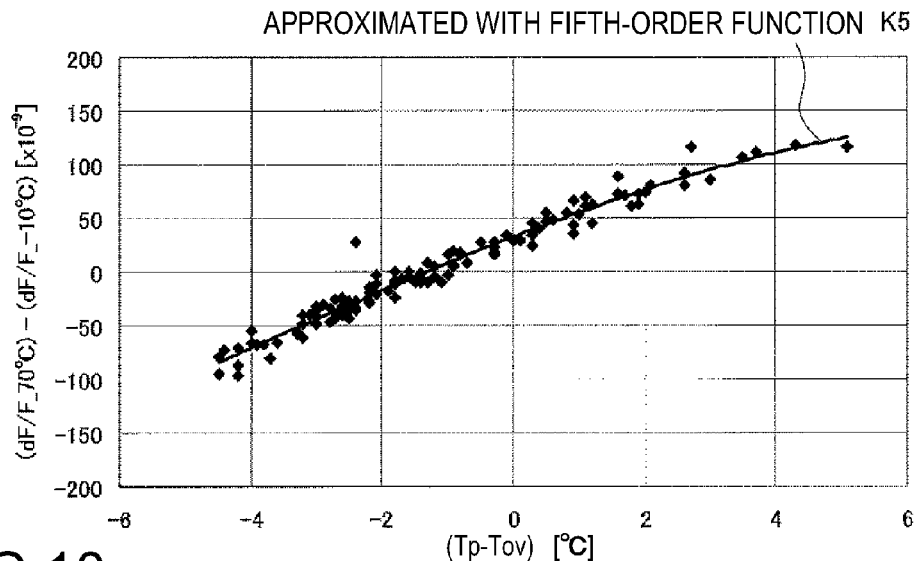
FIG. 10
REVERSE TEMPERATURE CHARACTERISTIC
COMPENSATION AMOUNT APPROXIMATE FORMULA   y
$$\begin{cases} \text{LINEAR FUNCTION}: y = b_1 * x + a_1 & (1) \\ \text{CUBIC FUNCTION}: y = d_3 * x^3 + c_3 * x^2 + b_3 * x + a_3 & (2) \\ \text{FIFTH-ORDER FUNCTION}: y = f_5 * x^5 + e_5 * x^4 + d_5 * x^3 + c_5 * x^2 + b_5 * x + a_5 & (3) \end{cases}$$
WHERE $x = (Tp - Tov)$
FIG. 11

CONSTANT-TEMPERATURE PIEZOELECTRIC OSCILLATOR AND METHOD OF MANUFACTURING THE SAME

CROSS-REFERENCE TO RELATED APPLICATIONS

This application is a continuation application of U.S. application Ser. No. 13/026,375 filed Feb. 14, 2011 which claims priority to Japanese Patent Application No. 2010-067497 filed Mar. 24, 2010 all of which are expressly incorporated by reference herein in their entireties.

BACKGROUND

1. Technical Field

The present invention relates to a constant-temperature piezoelectric oscillator provided with a frequency voltage control circuit for keeping the setting temperature of a thermostatic oven and compensating the temperature difference between the setting temperature and the peak temperature of a piezoelectric vibrator, and a method of manufacturing the constant-temperature piezoelectric oscillator.

2. Related Art

As crystal oscillators, which are frequency control device used for mobile communication devices or transmission communication devices, there have been known oven-controlled piezoelectric oscillator for outputting waves with highly stabilized frequency without being affected by external temperature variations. In recent years, the market requires small-sized, light-weight, and low power-consumption oven-controlled piezoelectric oscillators for various types of devices.

JP-A-10-303645 (Document 1) discloses an oven-controlled piezoelectric oscillator with reduced power consumption, and FIG. 12 is a block diagram thereof. The oven-controlled piezoelectric oscillator is provided with a heating element 62 for heating a voltage controlled piezoelectric oscillator 63 inside a thermostatic oven 61, an in-oven temperature-sensitive element 64 disposed inside the thermostatic oven 61, and an out-oven temperature-sensitive element 65 for detecting the ambient temperature outside the thermostatic oven. The oven-controlled piezoelectric oscillator is further provided with a control voltage generation circuit 67 for controlling the voltage of the voltage controlled piezoelectric oscillator 63 based on the temperature information from the out-oven temperature-sensitive element 65 to thereby vary the frequency thereof, and a temperature control circuit 66 for controlling the temperature of the heating element 62 based on temperature information of the temperature difference between the out-oven temperature-sensitive element 65 and the in-oven temperature-sensitive element 64.

In the oven-controlled piezoelectric oscillator shown in FIG. 12, the temperature inside the thermostatic oven has some variation, and therefore, the voltage-controlled piezoelectric oscillator 63 is used as the piezoelectric oscillator housed inside the thermostatic oven 61 so that the frequency can be controlled by supplying the voltage generated by the control voltage generation circuit 67 based on the temperature information from the temperature-sensitive elements.

Further, JP-A-2007-251366 (Document 2) discloses a constant-temperature crystal oscillator detecting the variation in ambient temperature and performing temperature control. FIG. 13 is a block diagram of a temperature compensation circuit of a circuit board disposed inside the oscillator having a single oven structure. The temperature compensation circuit is composed of a temperature sensor 71, an amplifier 72, an adder 73, a target temperature setting input terminal 74, an amplifier 75, an integrator 76, an adder 77, an amplitude adjusting resistor 78, a heater power supply terminal 79, a heater 80, a transistor 81, an adder 82, a frequency correction input terminal 83, an amplifier 84, a resistor 85, a variable-capacitance diode 86, a crystal vibrator 87, and a frequency output terminal 88. It is desirable that the temperature sensor 71 and the heater 80 are disposed on the circuit board and arranged near to the crystal vibrator 87.

The difference between the voltage output of the amplifier 72 based on the detection by the temperature sensor 71 and a target temperature input voltage 74 is detected by the adder 73 to output a first difference signal. The variation in the first difference signal due to the temperature variation is extracted, and the output of the adder 77 having the extracted signal and the first difference signal as the inputs lowers the collector voltage of the transistor 81 to thereby increase the current to the heater 80 so that the temperature rises if the ambient temperature drops. In contrast, if the ambient temperature rises, the current to the heater 80 is decreased. In order for correcting the frequency of the crystal vibrator, a correcting voltage value (a frequency correction signal) is set previously, and is input to the adder 82. According to the disclosure, a second difference signal is formed by detecting the difference from the extracted signal, and the vibration frequency of the crystal vibrator is controlled based on the second difference signal.

However, since the oven-controlled piezoelectric oscillator disclosed in Document 1 is a piezoelectric oscillator having temperature-sensitive elements disposed respectively inside and outside the thermostatic oven, and controlling the control voltage generation circuit and the temperature control circuit based on at least either one of the external temperature information and the internal temperature information, there arises a problem that the frequency stability of the oven-controlled piezoelectric oscillator is insufficient although the power consumption of the heating element for heating the inside of the thermostatic oven can be reduced.

Further, the crystal oscillator disclosed in Document 2 is made for attempting to enhance the frequency stability of the constant-temperature crystal oscillator by detecting the variation in the ambient temperature for performing the temperature control. However, it is premised on the fact that oven temperature is adjusted to the peak temperature of the crystal vibrator similarly to the existing constant-temperature crystal oscillator, and there arises a problem that the adjustment requires a large amount of work.

Besides the problems described above, in order for obtaining the highly stabilized piezoelectric oscillator, a requirement of tuning of the piezoelectric vibrating element with a high accuracy in the peak temperature becomes increasingly severe, and therefore, degradation in productivity and increase in production cost are incurred.

SUMMARY

An advantage of some aspects of the invention is to provide a highly stabilized constant-temperature piezoelectric oscillator dramatically reducing the adjusting work while keeping the working accuracy of the piezoelectric vibrator as in the past.

The invention can be implemented as the following forms or application examples.

Application Example 1

This application example of the invention is directed to a constant-temperature piezoelectric oscillator including a piezoelectric vibrator, an oscillation circuit adapted to excite the piezoelectric vibrator, a frequency voltage control circuit adapted to control an oscillation frequency in accordance with a voltage, a temperature control section adapted to keep the temperature of the piezoelectric vibrator constant, and an arithmetic circuit adapted to process information input and supply the frequency voltage control circuit with a signal, wherein the temperature control section includes a temperature-sensitive element adapted to sense the temperature, a heating element adapted to heat the piezoelectric vibrator, and a temperature control circuit adapted to control the temperature of the heating element based on a temperature signal of the temperature-sensitive element, the frequency voltage control circuit includes a voltage-controlled capacitance circuit capable of varying the capacitance value in accordance with the voltage, and a compensation voltage generation circuit, and the arithmetic circuit makes the compensation voltage generation circuit generate a voltage for compensating a frequency deviation due to a temperature difference between zero temperature coefficient temperature Tp of the piezoelectric vibrator and setting temperature Tov of the temperature control section based on a frequency-temperature characteristic compensation amount approximate formula adapted to compensate the frequency deviation, and then applies the voltage to the voltage-controlled capacitance circuit to compensate the frequency.

The setting temperature Tov of the temperature control section is set to constant temperature corresponding to the average value of the zero temperature coefficient temperature (the peak temperature) Tp of the piezoelectric vibrator. The frequency deviation of the frequency-temperature characteristics of the constant-temperature piezoelectric oscillator due to the temperature difference between the peak temperature Tp and the setting temperature Tov is obtained. The frequency deviation is compensated based on the frequency-temperature characteristic compensation amount approximate expression obtained from the frequency-temperature characteristics data of a number of constant-temperature piezoelectric oscillators. Specifically, the frequency voltage control circuit 7 is made to generate the capacitance for the frequency compensation, and then the constant-temperature piezoelectric oscillator functioning so as to compensate the frequency deviation described above is constituted using the capacitance value. Since the arithmetic circuit makes the compensation voltage generation circuit generate the compensation electrode voltage and then generates the capacitance for frequency compensation using the voltage to thereby compensate the frequency deviation of the frequency-temperature characteristics due to the temperature difference (Tp−Tov) only by setting the setting temperature Tov of the temperature control section to the constant value and inputting the peak temperature Tp and the setting temperature Tov of the piezoelectric vibrator, there is obtained an advantage that the adjustment process can be automated, adjustment of individual temperature control section can be eliminated, and therefore the man-hour can dramatically be reduced.

Application Example 2

This application example of the invention is directed to the constant-temperature piezoelectric oscillator of the application example 1 of the invention, wherein the piezoelectric vibrator is a crystal vibrator.

By using the crystal vibrator as the piezoelectric vibrator, in the case in which the variation in the stress (distortion) when being mounted in the manufacturing process, the distortion due to the temperature variation, or the change in the distortion due to the aging occurs, the crystal vibrator of the cutting angle having a smaller frequency variation can be used.

Application Example 3

This application example of the invention is directed to the constant-temperature piezoelectric oscillator of the application example 1 or 2 of the invention, wherein the frequency-temperature characteristic compensation amount approximate formula is approximated with a linear polynomial expression related to the temperature difference (Tp−Tov).

By approximating the frequency-temperature characteristic compensation amount approximate formula with the linear polynomial expression, there is obtained an advantage that the configuration of the compensation voltage generation circuit can be simplified while satisfying the frequency-temperature characteristics of the constant-temperature piezoelectric oscillator, and the man-hour for adjusting the temperature control section can dramatically be reduced.

Application Example 4

This application example of the invention is directed to the constant-temperature piezoelectric oscillator of the application example 1 or 2 of the invention, wherein the frequency-temperature characteristic compensation amount approximate formula is approximated with a cubic polynomial expression related to the temperature difference (Tp−Tov).

By approximating the frequency-temperature characteristic compensation amount approximate formula with the cubic polynomial expression, although the configuration of the compensation voltage generation circuit becomes more complicated than in the case of using the linear polynomial expression, there is obtained an advantage that the frequency-temperature characteristics of the constant-temperature piezoelectric oscillator can further be improved, and the man-hour for adjusting the temperature control section can dramatically be reduced.

Application Example 5

This application example of the invention is directed to the constant-temperature piezoelectric oscillator of the application example 1 or 2 of the invention, wherein the frequency-temperature characteristic compensation amount approximate formula is approximated with a fifth-order polynomial expression related to the temperature difference (Tp−Tov).

By approximating the frequency-temperature characteristic compensation amount approximate formula with the fifth-order polynomial expression, although the configuration of the compensation voltage generation circuit becomes complicated, there is obtained an advantage that the frequency-temperature characteristics of the constant-temperature piezoelectric oscillator can dramatically be improved, and the man-hour for adjusting the temperature control section can dramatically be reduced.

Application Example 6

This application example of the invention is directed to a method of manufacturing a constant-temperature piezoelectric oscillator, including (a) providing a piezoelectric vibrator, an oscillation circuit adapted to excite the piezoelectric vibrator, a frequency voltage control circuit adapted to control an oscillation frequency in accordance with a voltage, a temperature control section adapted to keep the temperature of the piezoelectric vibrator constant, and an arithmetic circuit adapted to process information input and supply the frequency voltage control circuit with a signal, the temperature control section including a temperature-sensitive element adapted to sense the temperature, a heating element adapted to heat the piezoelectric vibrator, and a temperature control circuit adapted to control the temperature of the heating element based on a temperature signal of the temperature-sensitive element, the frequency voltage control circuit including a voltage-controlled capacitance circuit capable of varying the capacitance value in accordance with the voltage, and a compensation voltage generation circuit, and the arithmetic circuit making the compensation voltage generation circuit generate a voltage for compensating a frequency deviation due to a temperature difference between zero temperature coefficient temperature Tp of the piezoelectric vibrator and setting temperature Tov of the temperature control section based on a frequency-temperature characteristic compensation amount approximate formula adapted to compensate the frequency deviation, and then applying the voltage to the voltage-controlled capacitance circuit to compensate the frequency, (b) measuring the peak temperature Tp of the piezoelectric vibrator, (c) setting the setting temperature Tov of the temperature control section, (d) obtaining coefficients of the reverse temperature characteristic compensation amount approximate formula created based on the frequency-temperature characteristic compensation amount approximate formula, (e) inputting the coefficients into the arithmetic circuit via an interface circuit, (f) making the compensation voltage generation circuit generate the frequency-temperature characteristic compensation voltage in accordance with a signal from the arithmetic circuit, and (g) adjusting the frequency of the constant-temperature piezoelectric oscillator.

The relational expression between the difference ($dF/F|_{Th} - dF/F|_{Tl}$) between the frequency deviation $dF/F|_{Th}$ at high temperature Th and the frequency deviation $dF/F|_{Tl}$ at low temperature Tl and the temperature difference (Tp−Tov), namely the frequency-temperature characteristic compensation amount approximate formula, is previously obtained by measuring the frequency-temperature characteristic data of a number of constant-temperature piezoelectric oscillators having the setting temperature of the temperature control section constant, and then the reverse temperature characteristic compensation amount approximate formula having the reverse characteristics of the relational expression is obtained in advance.

The peak temperature Tp of the piezoelectric vibrator is measured, the setting temperature Tov of the temperature control section is set, and then the coefficients of the reverse temperature characteristic compensation amount approximate formula are obtained by inputting the data Tp, Tov to store the coefficients into the memory of the arithmetic circuit. The arithmetic circuit makes the frequency voltage control circuit generate the compensation voltage based on the coefficients stored in the memory, and then generates the capacitance for compensating the frequency based on the voltage. As described above, by previously obtaining the frequency-temperature characteristic compensation amount approximate formula, the adjustment of the constant-temperature piezoelectric oscillator is completed only by inputting Tp and Tov, and therefore, the man-hour can dramatically be reduced in the manufacturing method.

BRIEF DESCRIPTION OF THE DRAWINGS

The invention will be described with reference to the accompanying drawings, wherein like numbers reference like elements.

FIG. 9 is a diagram showing the case of approximating the distribution chart of the temperature difference between the peak temperature Tp and the setting temperature Tov, and the difference of the frequency deviation between the temperature of 70° C. and the temperature of −10° C. with a cubic function.

FIG. 10 is a diagram showing the case of approximating the distribution chart of the temperature difference between the peak temperature Tp and the setting temperature Tov, and the difference of the frequency deviation between the temperature of 70° C. and the temperature of −10° C. with a fifth-order function.

FIG. 11 is a diagram showing the formulas and the coefficients of linear function formula, cubic function formula, and fifth-order function formula in the case of obtaining the reverse temperature characteristic compensation amount approximate formula having a reverse characteristics from a frequency-temperature characteristic compensation amount approximate formula.

DESCRIPTION OF EXEMPLARY EMBODIMENT

Figure 1:
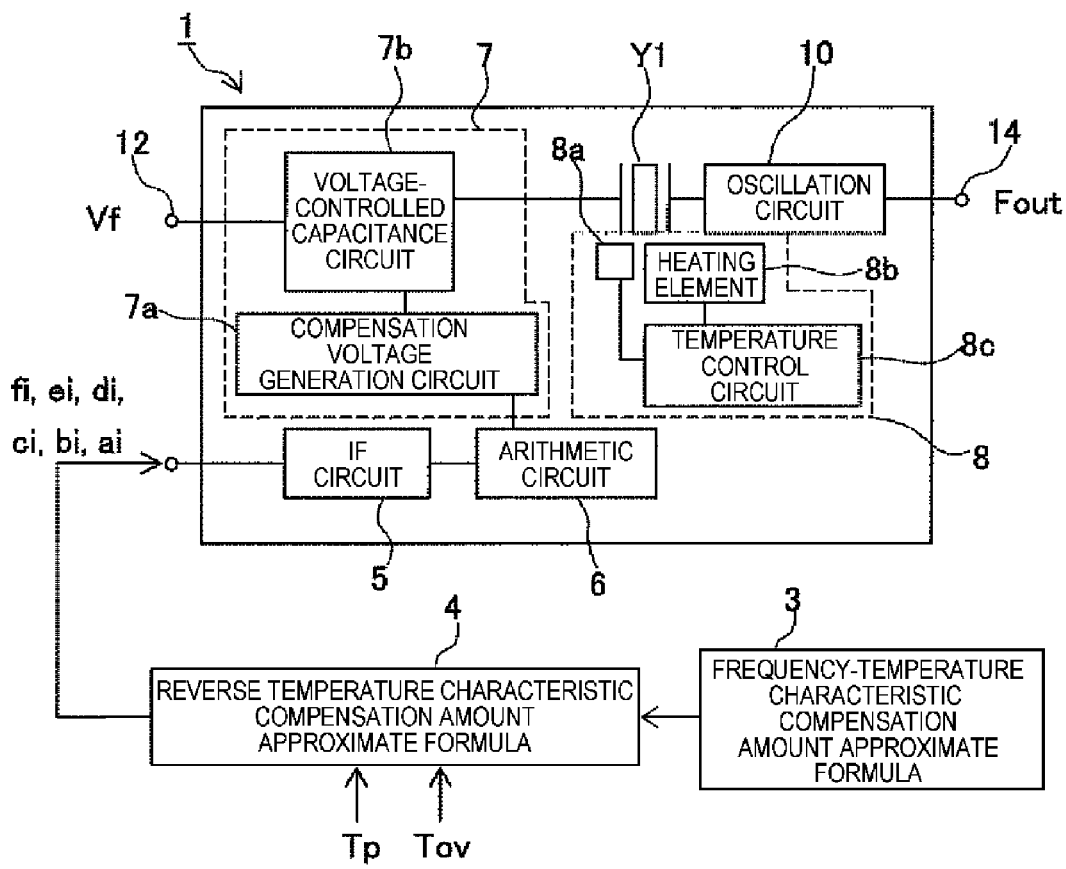
FIG. 1 is a block diagram showing a configuration of a constant-temperature piezoelectric oscillator 1 and a compensation method according to an embodiment of the invention.

An embodiment of the invention will hereinafter be explained in detail with reference to the accompanying drawings. FIG. 1 is a schematic block diagram showing a constant-temperature piezoelectric oscillator 1 according to an embodiment of the invention.

The constant-temperature piezoelectric oscillator 1 is provided with a piezoelectric vibrator Y1, an oscillation circuit 10 for exciting the piezoelectric vibrator Y1, a frequency voltage control circuit 7 for controlling the oscillation frequency of the piezoelectric oscillator composed of the piezoelectric vibrator Y1 and the oscillation circuit 10 by voltage, a temperature control section 8 for keeping the temperature of the piezoelectric vibrator Y1 constant, and an arithmetic circuit 6 for processing the information input thereto and then supplying the frequency voltage control circuit 7 with a signal.

The temperature control section 8 has a temperature-sensitive element 8a for sensing the temperature around the piezoelectric vibrator Y1, a heating element 8b for heating the piezoelectric vibrator Y1, and a temperature control circuit 8c for controlling the temperature of the heating element 8b to the predetermined temperature based on the temperature signal from the temperature-sensitive element 8a.

The frequency voltage control circuit 7 has a voltage-controlled capacitance circuit 7b including a plurality of capacitive elements each having a capacitance value varied by the voltage, and a compensation voltage generation circuit 7a for generating the voltage to be applied to the voltage-controlled capacitance circuit 7b based on the information from the arithmetic circuit 6.

The constant-temperature piezoelectric oscillator 1 is configured so that the arithmetic circuit 6 makes the compensation voltage generation circuit 7a generate the voltage for compensating the frequency deviation in the frequency-temperature characteristics of the constant-temperature piezoelectric oscillator 1 caused by the temperature difference between the zero temperature coefficient temperature (the peak temperature) Tp of the piezoelectric vibrator Y1 and the setting temperature Tov of the temperature control section 8 based on the reverse temperature characteristic compensation amount approximate formula 4 having the reverse characteristics of the frequency-temperature characteristic compensation amount approximate formula 3, and apply the voltage to the voltage-controlled capacitance circuit 7b, thereby compensating the output frequency.

It should be noted that the constant-temperature piezoelectric oscillator 1 has a capacitive element slightly varying the center frequency in accordance with the voltage Vf applied from the outside to a frequency control input terminal 12 in the voltage-controlled capacitance circuit 7b, and the frequency is output from an output frequency terminal 14.

Figure 2:
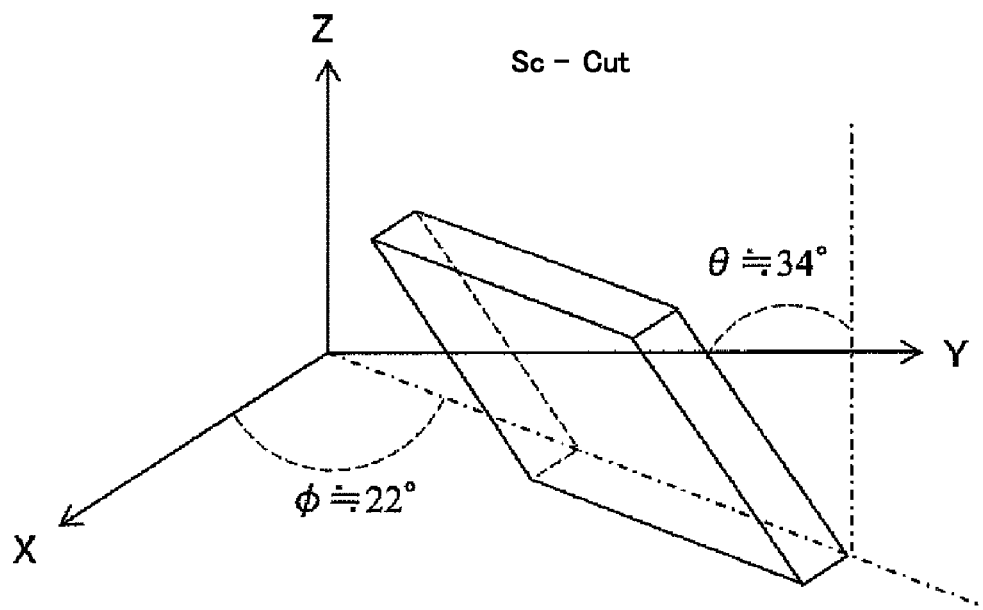
FIG. 2 is a schematic diagram showing a cutting angle in an example of SC cut.
Figure 3:
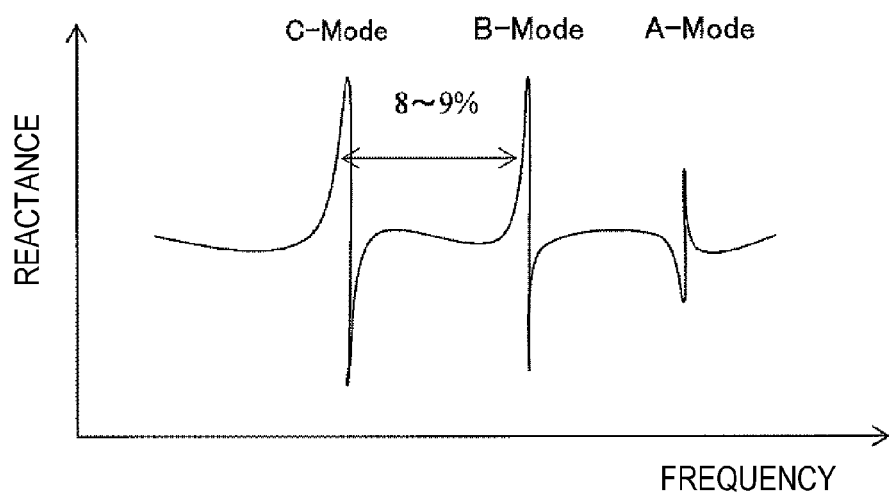
FIG. 3 is a graph showing a frequency-reactance curve of an SC-cut crystal vibrator.

In the past, a crystal vibrator using a double rotation cut crystal substrate an example of which is shown in FIG. 2 has been used for the constant-temperature piezoelectric oscillator (the oven-controlled highly stabilized piezoelectric oscillator). The SC-cut crystal vibrator will be explained as an example. As shown in FIG. 2, the stress-compensated cut (SC-cut) crystal vibrator is a vibrator formed by polishing the crystal substrate, which is rotated θ (about 34 degrees) around the X-axis, then rotated φ (about 22 degrees) around the Z'-axis, and then carved out, to have a predetermined thickness, and then attaching excitation electrodes on the both principal surfaces thereof. The SC-cut crystal vibrator is excited in three vibration modes, namely a C-mode, a B-mode, and an A-mode as shown in FIG. 3, and the crystal oscillator is configured using the C-mode among the three modes. An example of an inflection point in the C-mode exists on the high temperature side of about 95 degrees in comparison with an example of an inflection point in the AT-cut crystal vibrator exists at about 27.5 degrees, and is suitable for a highly stabilized crystal oscillator configured using the thermostatic oven. It should be noted that the inflection point is significantly dependent on the cutting angle φ.

The SC-cut crystal vibrator is required to be manufactured so as to have a local maximum value and at the same time the peak temperature Tp of the zero temperature coefficient with a little variation. Further, it is also required to adjust the setting temperature of the thermostatic oven for housing the SC-cut crystal vibrator to the peak temperature Tp with high accuracy. Since the peak temperature Tp is slightly different between the SC-cut crystal vibrators, the operation for adjusting the temperature of the thermostatic oven in accordance with the peak temperature Tp of each of the SC-cut crystal vibrators is a man-hour consuming work.

Figure 4:
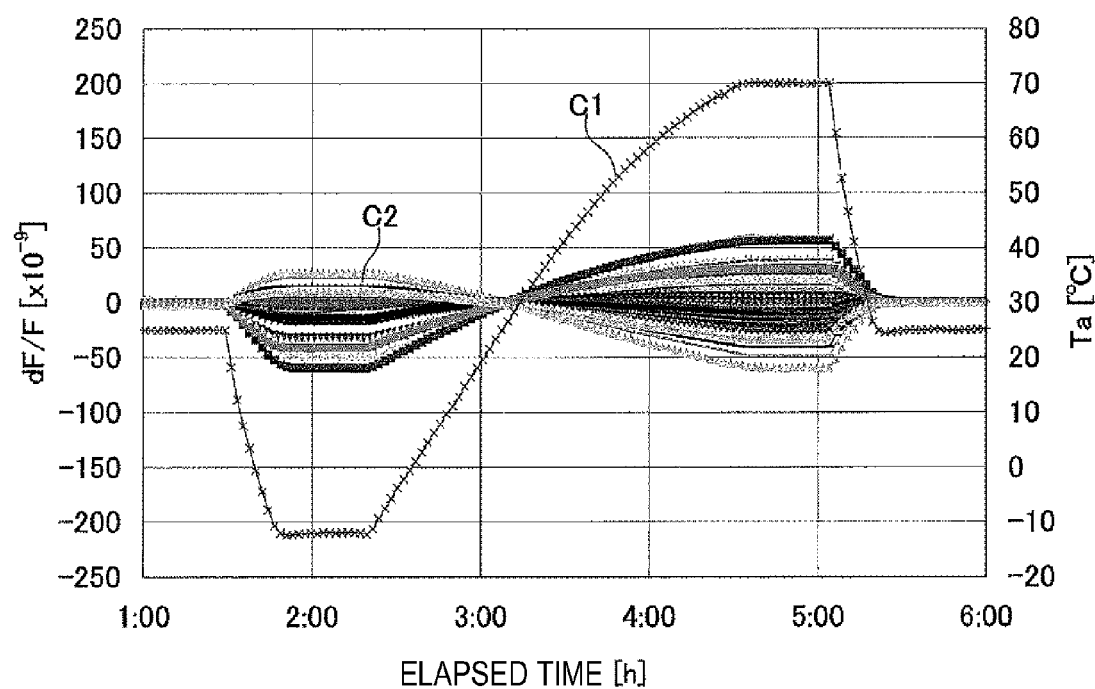
FIG. 4 is a diagram showing the temporal variation of the ambient temperature, and the corresponding frequency-temperature characteristics of the constant-temperature piezoelectric oscillator.

Therefore, it is conducted as a trial to measure the frequency-temperature characteristics of the constant-temperature piezoelectric oscillators incorporating the SC-cut crystal vibrators not sorted by the peak temperature Tp in the thermostatic oven with the setting temperature kept constant. In FIG. 4, the horizontal axis represents the elapsed time (h), one (on the left side) of the vertical axes represents the frequency deviation dF/F ($=(F-F_0)/F_0$, wherein $F_0$ denotes the center frequency), and the other (on the right side) of the vertical axes represents the ambient temperature Ta (° C.). The ambient temperature Ta of the thermostatic oven is kept at ordinary temperature, then lowered from the ordinary temperature to −10° C. and kept for a predetermined period of time, then raised to 70° C. gradually and kept at 70° C. for a predetermined period of time, and then returned to the ordinary temperature. The curve C1 shows the relationship between the elapsed time and the ambient temperature Ta of the thermostatic oven on that occasion.

A group of curves C2 shows the frequency deviations dF/F ($\times 10^{-9}$) with respect to the ambient temperature Ta in the respective constant-temperature piezoelectric oscillators.

Figure 5:
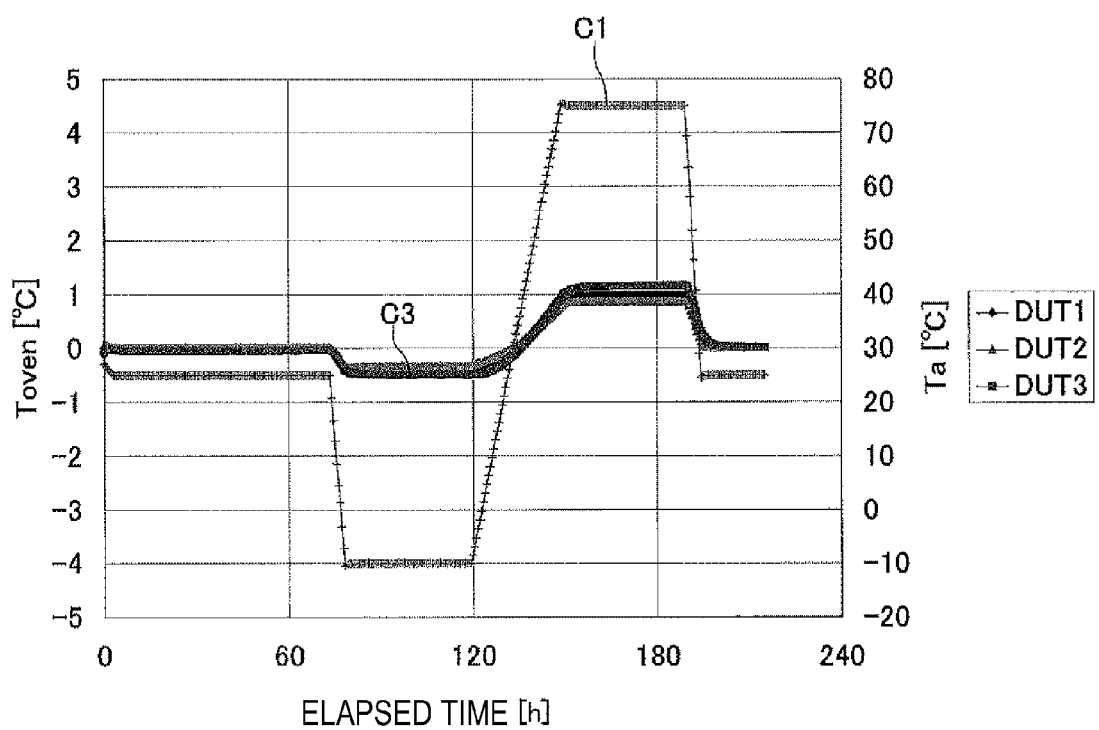
FIG. 5 is a diagram showing the temporal variation of the ambient temperature, and the corresponding variation in the internal temperature of the thermostatic oven.

FIG. 5 is a diagram showing a relationship between the ambient temperature Ta of the thermostatic oven and the internal temperature Tov. The horizontal axis represents the elapsed time (h), one (on the left side) of the vertical axes represents the temperature difference between the setting temperature of the thermostatic oven and the internal temperature Tov, and the other (on the right side) of the vertical axes represents the ambient temperature Ta (° C.). The ambient temperature Ta of the thermostatic oven is kept at ordinary temperature, then lowered from the ordinary temperature to −10° C. and kept for a predetermined period of time, then raised to 70° C. and kept at 70° C. for a predetermined period of time, and then returned to the ordinary temperature. The curve C1 shows the relationship between the elapsed time and the ambient temperature Ta of the thermostatic oven on that occasion.

In the drawing, the curve C3 illustrates the variation in the temperature difference between the setting temperature of the thermostatic oven and the internal temperature Tov, with respect to the variation in the ambient temperature Ta. Although at the ordinary temperature the temperature difference between the setting temperature of the thermostatic oven and the internal temperature Tov is zero, the temperature difference varies about 0.5° C. toward the lower side with the ambient temperature Ta of −10° C., and varies about 1° C. toward the higher side with the ambient temperature Ta of 70° C. In other words, the internal temperature Tov of the thermostatic oven slightly varies due to the variation in the ambient temperature Ta, and becomes slightly lower than the setting temperature at lower ambient temperature Ta or slightly higher than the setting temperature at higher ambient temperature Ta.

Figure 6:
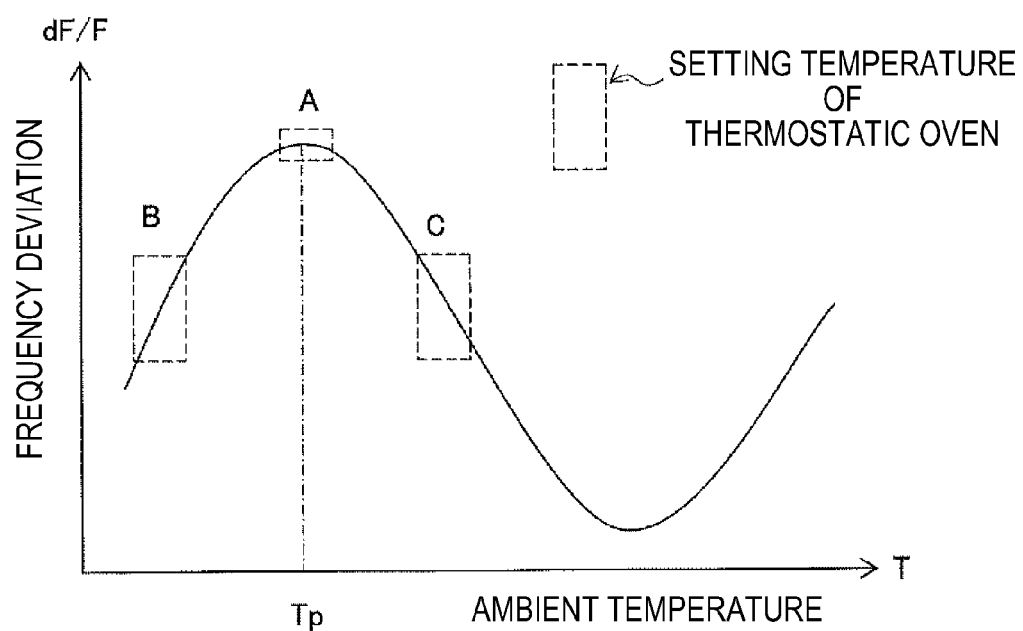
FIG. 6 is a graph showing frequency-temperature characteristics of the SC-cut crystal vibrator, and the setting temperature range of the thermostatic oven.

FIG. 6 is a diagram showing the frequency-temperature characteristic curve of the SC-cut crystal vibrator, and shows the frequency-temperature characteristics in the vicinity of the inflection point. It is desirable to set the temperature Tov of the thermostatic oven to the temperature of the local maximum value of the frequency-temperature characteristic curve of the SC-cut crystal vibrator, namely the zero temperature coefficient temperature (the peak temperature Tp). In other words, it is desirable to set it in the area A of the frequency-temperature characteristic curve shown in FIG. 6. However, the appearance of the frequency variation in the constant-temperature piezoelectric oscillator in the case of slightly varying the internal temperature Tov of the thermostatic oven due to the variation in the ambient temperature Ta as shown in FIG. 5 is different between the case of setting the setting temperature Tov in the area B on the lower side of the peak temperature Tp and the case of setting the setting temperature Tov in the area C on the higher temperature side of the peak temperature Tp.

Figure 7:
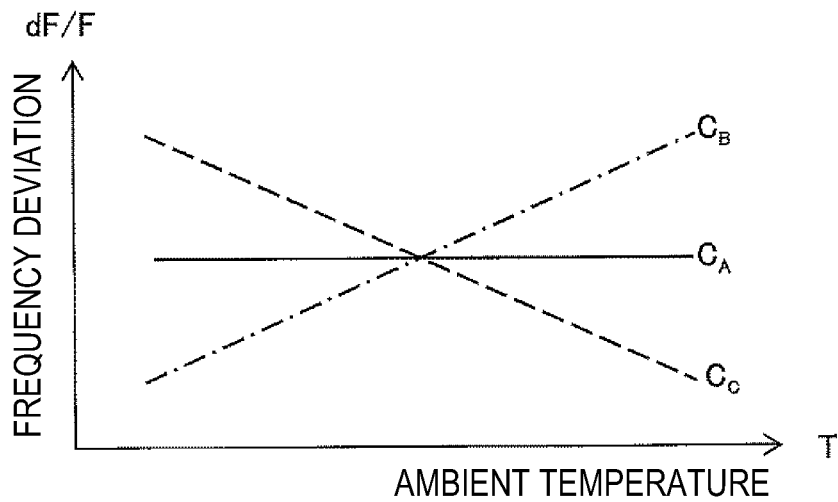
FIG. 7 is a diagram showing a changing trend of the frequency deviation due to the temperature variation in the thermostatic oven by the difference between the peak temperature Tp and the setting temperature Tov of the thermostatic oven.

FIG. 6 is a diagram showing the frequency variation in the SC-cut crystal vibrator with respect to a slight variation in the ambient temperature Ta assuming that the horizontal axis represents the ambient temperature Ta and the vertical axis represents the frequency deviation of the SC-cut crystal vibrator. In the case of setting the internal temperature Tov of the thermostatic oven to the peak temperature Tp of the SC-cut crystal vibrator, namely in the area A of FIG. 6, the frequency deviation dF/F of the constant-temperature piezoelectric oscillator does not vary as illustrated by the curve $C_A$ shown in FIG. 7 even in the case in which the internal temperature Tov varies slightly. In the case of setting the internal temperature Tov of the thermostatic oven to the lower temperature side of the peak temperature Tp, namely in the area B of FIG. 6, the frequency deviation dF/F of the constant-temperature piezoelectric oscillator increases as illustrated by the curve $C_B$ shown in FIG. 7 in conjunction with the internal temperature Tov in the case in which the internal temperature Tov rises slightly. Further, in the case of setting the internal temperature Tov to the higher temperature side of the peak temperature Tp, namely in the area C of FIG. 6, the frequency deviation dF/F decreases as illustrated by the curve $C_c$ shown in FIG. 7 in the case in which the internal temperature Tov rises slightly, in the other way round.

By contraries, the variation in the frequency deviation of the constant-temperature piezoelectric oscillators configured by housing the SC-cut crystal vibrators having variations in peak temperature Tp in the thermostatic ovens with the same setting temperature Tov is substantially the same as described above.

Figure 8:
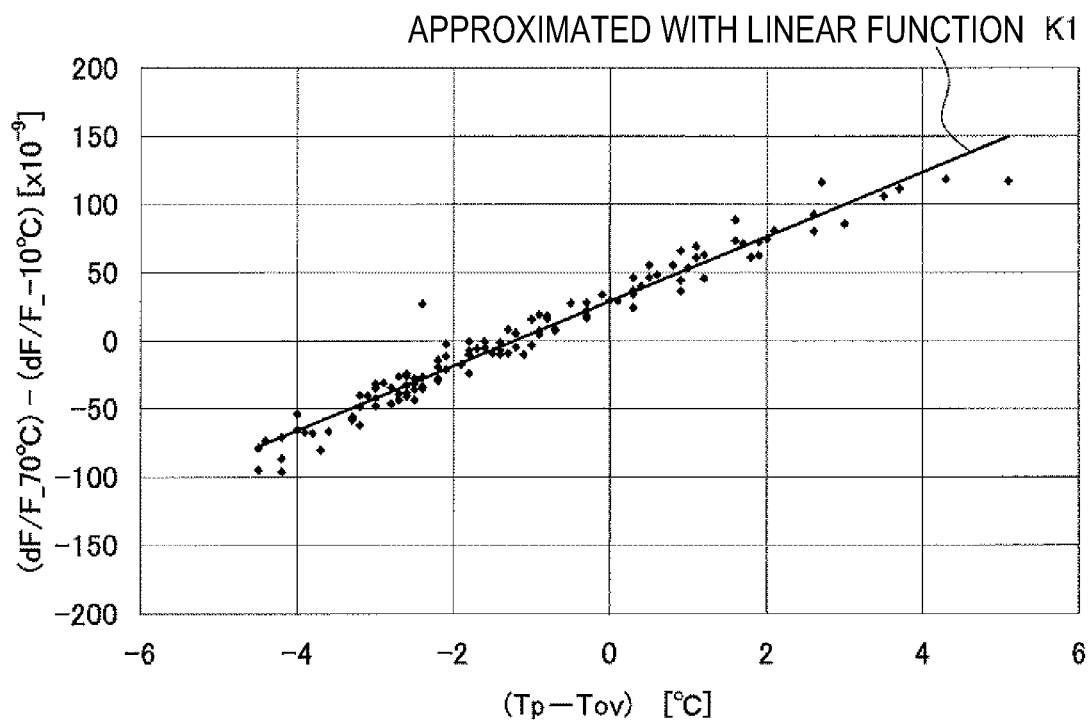
FIG. 8 is a diagram showing the case of approximating the distribution chart of the temperature difference between the peak temperature Tp and the setting temperature Tov, and the difference of the frequency deviation between the temperature of 70° C. and the temperature of −10° C. with a linear function.
Figure 12:
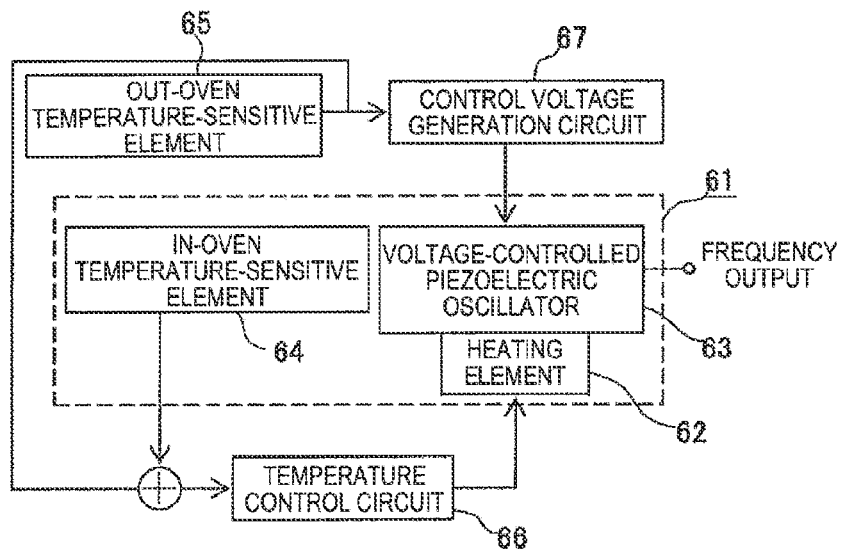
FIG. 12 is a block diagram showing a configuration of an oven-controlled piezoelectric oscillator of the related art.
Figure 13:
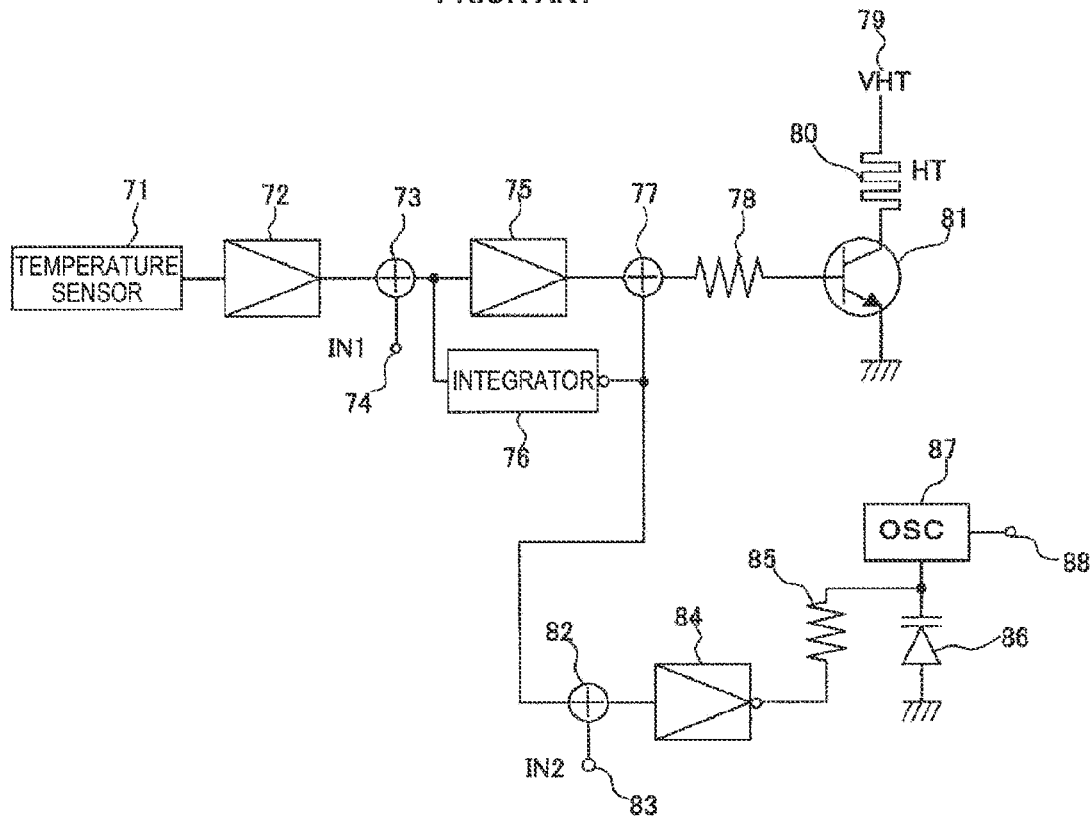
FIG. 13 is a block diagram of a temperature compensation circuit of the related art.

The frequency-temperature characteristic of the constant-temperature piezoelectric oscillator shown in FIG. 4 is reconsidered. FIG. 8 is obtained by representing the temperature difference (Tp−Tov) between the peak temperature Tp of the SC-cut crystal vibrator and the setting temperature (internal temperature) Tov of the thermostatic oven by the horizontal axis, and the difference (dF/F__70° C.−dF/F__−10° C.) between the frequency deviation dF/F__70° C. of the constant-temperature piezoelectric oscillator at 70° C. and the frequency deviation dF/F__−10° C. of the constant-temperature piezoelectric oscillator at −10° C. by the vertical axis, and replotting the data of the frequency-temperature characteristics shown in FIG. 4. It is found out from FIG. 8 that a strong correlation exists between the temperature difference (Tp−Tov) and the difference (dF/F__70° C.−dF/F__−10° C.) between the frequency deviations. FIG. 8 shows an example of approximating the correlation with a linear function. FIG. 8 provides the thought that by compensating the difference (dF/F__70° C.−dF/F__−10° C.) between the frequency deviations, the frequency-temperature characteristics of the constant-temperature piezoelectric oscillator can be adjusted within the desired stability without tuning the setting temperature Tov of the thermostatic oven into the peak temperature Tp of the SC-cut crystal vibrator.

The peak temperature Tp of each of a number of SC-cut crystal vibrators is measured, and the temperature Tov of the thermostatic oven is set to the average temperature of the peak temperature. The peak temperature Tp of each of the SC-cut crystal vibrators is measured to obtain the temperature difference (Tp−Tov). By fitting the temperature difference (Tp−Tov) into the horizontal axis of FIG. 8, the difference (dF/F__70° C.−dF/F__−10° C.) between the frequency deviations caused in the constant-temperature piezoelectric vibrator can be estimated from the vertical axis. In order for fitting the frequency-temperature characteristics of the constant-temperature piezoelectric oscillator within the desired stability, it is enough to set the difference (dF/F__70° C.−dF/F__−10° C.) thus estimated to zero. In other words, it is sufficient to compensate the oscillation frequency of the constant-temperature piezoelectric oscillator as much as −(dF/F__70° C.−dF/F__−10° C.).

Therefore, it is enough to obtain the reverse temperature characteristic compensation amount approximate formula having the reverse characteristics of the frequency-temperature characteristic compensation amount approximate curve K1 shown in FIG. 8, obtain a frequency compensation amount by substituting the peak temperature Tp and the setting internal temperature Tov into the reverse temperature characteristic compensation amount approximate formula, and add the frequency compensation amount to the oscillation frequency of the constant-temperature piezoelectric oscillator.

FIG. 9 shows the case of approximating the relationship between the temperature difference (Tp−Tov) and the difference (dF/F__70° C.−dF/F__−10° C.) between the frequency deviations with a cubic function K3, and FIG. 10 shows the case of approximating it with a fifth-order function K5. The more the order of the function is raised, the more the level of accuracy of the approximation rises, and therefore, the frequency deviation of the constant-temperature piezoelectric oscillator can be made closer to zero. However, in the case of realizing the function with a circuit, the circuit becomes more complicated.

The frequency-temperature characteristic compensation amount approximate formula 3 shown in FIG. 1 is obtained by using the either one of the linear function approximate formula K1, the cubic function approximate formula K3, and the fifth-order function approximate formula K5, and the reverse characteristics of the formula thus obtained is set to the reverse temperature characteristic compensation approximate formula 4. Here, the reverse characteristics denote the formula obtained by replacing Y with −y, and X with x, in the case in which the linear function approximate formula K1 shown in FIG. 8 can be expressed by $Y=\alpha X+\beta$ (here, X=(Tp−Tov), Y=dF/F__70° C.−dF/F__−10° C.), for example. Specifically, $y=-(\alpha X+\beta)$ (here, x=(Tp−Tov), y=dF/F__70° C.−dF/F__−10° C.) is called the reverse characteristics of Y. The same can also be applied to the cubic function approximate formula and the fifth-order function approximate formula.

In the case of expressing the reverse temperature characteristic compensation amount approximate formula 4 with, for example, a fifth-order polynomial expression, the fifth order coefficient is denoted by $f_5$, the fourth order coefficient is denoted by $e_5$, the third order coefficient is denoted by $d_5$, the second order coefficient is denoted by $c_5$, the first order coefficient is denoted by $b_5$, and the constant term is denoted by $a_5$, and the coefficients $f_5$, $e_5$, $d_5$, $c_5$, $b_5$, and $a_5$ are output from a personal computer (PC) or the like to the interface circuit 5 of the constant-temperature piezoelectric oscillator 1, and the coefficients $f_5$, $e_5$, $d_5$, $c_5$, $b_5$, and $a_5$ are then stored in the memory of the arithmetic circuit 6. The compensation voltage generation circuit 7a of the frequency voltage control circuit 7 generates the voltage of the fifth-order function based on the coefficients $f_5$, $e_5$, $d_5$, $c_5$, $b_5$, and $a_5$ stored in the memory, and then applies the voltage to the voltage-controlled capacitance circuit 7b. The voltage-controlled capacitance circuit 7b expresses the capacitance value corresponding to the voltage applied thereto, and since the capacitance value is connected in series to the piezoelectric vibrator Y1, the oscillation frequency of the piezoelectric vibrator composed of the piezoelectric vibrator Y1 and the oscillation circuit 10 can be varied. The frequency variation corresponds to a frequency variation obtained by attaching a minus sign to the difference (dF/F_70° C.–dF/F_–10° C.) between the frequency deviations corresponding to the temperature difference (Tp–Tov) shown in FIG. 10, for example, and acts so as to compensate the frequency deviation caused by the temperature difference (Tp–Tov) to zero.

The setting temperature Tov of the temperature control section is set to constant temperature corresponding to the average value of the peak temperature Tp of the piezoelectric vibrator. The frequency deviation of the frequency-temperature characteristics of the constant-temperature piezoelectric oscillator due to the temperature difference between the peak temperature Tp and the setting temperature Tov is obtained. The frequency deviation is compensated based on the frequency-temperature characteristic compensation amount approximate formula 3 obtained from the frequency-temperature characteristics data of a number of constant-temperature piezoelectric oscillators. Specifically, the frequency voltage control circuit 7 is made to generate the capacitance for the frequency compensation, and then the constant-temperature piezoelectric oscillator functioning so as to compensate the frequency deviation described above is constituted using the capacitance value.

Since the arithmetic circuit 6 makes the compensation voltage generation circuit 7a generate the compensation electrode voltage and then generates the capacitance for frequency compensation using the voltage to thereby compensate the frequency deviation of the frequency-temperature characteristics due to the temperature difference (Tp–Tov) only by setting the setting temperature Tov of the temperature control section to the constant value and inputting the peak temperature Tp and the setting temperature Tov of the piezoelectric vibrator, there is obtained an advantage that the adjustment process can be automated, adjustment of individual temperature control section can be eliminated, and therefore the man-hour can dramatically be reduced.

Further, by using the SC-cut crystal vibrator as the piezoelectric vibrator Y1, there is obtained an advantage that in the case in which the variation in the stress (distortion) when being mounted in the manufacturing process, the distortion due to the temperature variation, or the change in the distortion due to the aging occurs, the frequency variation is smaller compared to the crystal vibrator with a different cutting angle.

FIG. 11 is a diagram showing the formulas corresponding to the linear function, the cubic function, and the fifth-order function expressing the reverse temperature characteristic compensation amount approximate formula 4. It should be noted that x represents the temperature difference between the peak temperature Tp of the SC-cut crystal vibrator and the setting temperature Tov of the thermostatic oven, and y represents the frequency deviation compensation amount of the frequency-temperature characteristics.

By approximating the frequency-temperature characteristic compensation amount approximate formula 3 with the linear polynomial expression, there is obtained an advantage that the configuration of the compensation voltage generation circuit can be simplified while satisfying the frequency-temperature characteristics of the constant-temperature piezoelectric oscillator, and the man-hour for adjusting the temperature control section can dramatically be reduced. Further, by approximating the frequency-temperature characteristic compensation amount approximate formula 3 with the cubic polynomial expression, although the configuration of the compensation voltage generation circuit becomes more complicated than in the case of using the linear polynomial expression, there is obtained an advantage that the frequency-temperature characteristics of the constant-temperature piezoelectric oscillator can further be improved, and the man-hour for adjusting the temperature control section can dramatically be reduced.

Further, by approximating the frequency-temperature characteristic compensation amount approximate formula with the fifth-order polynomial expression, although the configuration of the compensation voltage generation circuit becomes complicated, there is obtained an advantage that the frequency-temperature characteristics of the constant-temperature piezoelectric oscillator can dramatically be improved, and the man-hour for adjusting the temperature control section can dramatically be reduced.

A manufacturing method according to the invention is a method of manufacturing the constant-temperature piezoelectric oscillator described above, including a piezoelectric vibrator measurement step of measuring the peak temperature Tp of the piezoelectric vibrator Y1, a temperature control section adjustment step of setting the setting temperature Tov of the temperature control section 8, a step of obtaining the coefficients of the reverse temperature characteristic compensation amount approximate formula 4 created based on the frequency-temperature characteristic compensation amount approximate formula 3, a step of inputting the coefficients into the arithmetic circuit 6 via the interface circuit 5, a step of making the compensation voltage generation circuit 7a generate the compensation voltage in accordance with a signal from the arithmetic circuit 6, a step of generating the capacitance in the voltage-controlled capacitance circuit 7b in accordance with the voltage, and a step of adjusting the frequency of the constant-temperature piezoelectric oscillator in accordance with the capacitance value of the capacitance.

The relational expression between the difference $(dF/F|_{Th} - dF/F|_{Tl})$ between the frequency deviation $dF/F|_{Th}$ at high temperature Th and the frequency deviation $dF/F|_{Tl}$ at low temperature Tl and the temperature difference (Tp–Tov), namely the frequency-temperature characteristic compensation amount approximate formula 3, is previously obtained by measuring the frequency-temperature characteristic data of a number of constant-temperature piezoelectric oscillators 1 having the setting temperature Tov of the temperature control section 8 constant, and then the reverse temperature characteristic compensation amount approximate formula 4 having the reverse characteristics of the relational expression is obtained in advance.

The peak temperature Tp of the piezoelectric vibrator Y1 is measured, the setting temperature Tov of the temperature control section 8 is set, and then the coefficients of the reverse temperature characteristic compensation amount approximate formula 4 are obtained by inputting the data Tp, Tov to store the coefficients into the memory of the arithmetic circuit. The arithmetic circuit 8 makes the frequency voltage control circuit 7 generate the compensation voltage based on the coefficients stored in the memory, and then generates the capacitance for compensating the frequency based on the voltage. As described above, by previously obtaining the frequency-temperature characteristic compensation amount approximate formula 3, the adjustment of the constant-temperature piezoelectric oscillator is completed only by inputting Tp and Tov, and therefore, the man-hour can dramatically be reduced in the manufacturing method.

It should be noted that although the explanation is presented showing the SC-cut crystal vibrator as an example, the invention can also be put into practice in a crystal vibrator with a different cutting angle.

What is claimed is:

1. A constant-temperature oscillator, comprising:
   a vibrator that has a zero temperature coefficient as a frequency-temperature characteristic;
   an oscillation circuit that excites the vibrator;
   a voltage-controlled capacitance circuit that configures a resonant circuit with the vibrator;
   a temperature controller that controls a temperature of the vibrator so as to adjust the temperature to a predetermined temperature; and
   a compensation voltage generation circuit that outputs a compensation voltage to the voltage-controlled capacitance circuit, wherein
   the compensation voltage compensates an oscillating frequency deviation between a first oscillating frequency of the oscillation circuit when the vibrator is at a zero temperature coefficient temperature and a second oscillating frequency of the oscillation circuit when the vibrator is at the predetermined temperature.

2. The constant-temperature oscillator according to claim 1, further comprising:
   an arithmetic circuit that outputs a signal to the compensation voltage generation circuit, wherein
   the signal dictates the compensation voltage.

3. The constant-temperature oscillator according to claim 2, wherein
   the arithmetic circuit has a memory that stores data for setting the signal.

4. The constant-temperature oscillator according to claim 3, wherein
   the data is a coefficient of a linear polynomial expression related to the compensation voltage.

5. The constant-temperature oscillator according to claim 3, wherein
   the data is a coefficient of a cubic polynomial expression related to the compensation voltage.

6. The constant-temperature oscillator according to claim 3, wherein
   the data is a coefficient of a fifth-order polynomial expression related to the compensation voltage.

7. A method for manufacturing a constant-temperature oscillator, comprising:
   providing:
      a vibrator that has a zero temperature coefficient as a frequency-temperature characteristic,
      an oscillation circuit that excites the vibrator,
      a voltage-controlled capacitance circuit that configures a resonant circuit with the vibrator,
      a temperature controller that controls a temperature of the vibrator so as to adjust the temperature to a predetermined temperature,
      a compensation voltage generation circuit that outputs a compensation voltage to the voltage-controlled capacitance circuit, the compensation voltage compensating an oscillating frequency deviation between a first oscillating frequency of the oscillation circuit when the vibrator is at a zero temperature coefficient temperature and a second oscillating frequency of the oscillation circuit when the vibrator is at the predetermined temperature, and
      a memory that stores data for determining the compensation voltage;
   measuring the zero temperature coefficient temperature of the vibrator;
   storing the zero temperature coefficient temperature into the memory;
   heating the vibrator to the predetermined temperature by the temperature controller;
   storing the data associated with a temperature difference between the zero temperature coefficient temperature and the predetermined temperature and associated with the oscillating frequency deviation;
   providing the compensation voltage to the voltage-controlled capacitance circuit from the compensation voltage generation circuit; and
   adjusting an oscillating frequency of the constant-temperature oscillator.

8. The method for manufacturing a constant-temperature oscillator according to claim 7, wherein
   the data is a coefficient of a linear polynomial expression related to the compensation voltage.

9. The method for manufacturing a constant-temperature oscillator according to claim 7, wherein
   the data is a coefficient of a cubic polynomial expression related to the compensation voltage.

10. The method for manufacturing a constant-temperature oscillator according to claim 7, wherein
    the data is a coefficient of a fifth-order polynomial expression related to the compensation voltage.

11. A frequency voltage control circuit, comprising:
    an oscillation circuit that excites a vibrator that has a zero temperature coefficient as a frequency-temperature characteristic;
    a voltage-controlled capacitance circuit that compensates an oscillating frequency of the oscillation circuit;
    a temperature controller that controls a temperature of the vibrator so as to adjust the temperature to a predetermined temperature; and
    a compensation voltage generation circuit that outputs a compensation voltage to the voltage-controlled capacitance circuit, wherein
    the compensation voltage compensates an oscillating frequency deviation between a first oscillating frequency of the oscillation circuit when the vibrator is at a zero temperature coefficient temperature and a second oscillating frequency of the oscillation circuit when the vibrator is at the predetermined temperature.

12. The frequency voltage control circuit according to claim 11, further comprising:
    an arithmetic circuit that outputs a signal to the compensation voltage generation circuit, wherein
    the signal dictates the compensation voltage.

13. The frequency voltage control circuit according to claim 12, wherein
    the arithmetic circuit has a memory that stores data for setting the signal.

14. The frequency voltage control circuit according to claim 13, wherein
    the data is a coefficient of a linear polynomial expression related to the compensation voltage.

15. The frequency voltage control circuit according to claim 13, wherein
    the data is a coefficient of a cubic polynomial expression related to the compensation voltage.

16. The frequency voltage control circuit according to claim 13, wherein
    the data is a coefficient of a fifth-order polynomial expression related to the compensation voltage.

* * * * *